United States Patent [19]

Eberhard

[11] 3,719,835

[45] March 6, 1973

[54] VARIABLE DELAY, MOS, MONOSTABLE PULSE GENERATING CIRCUIT

[75] Inventor: Everett Eberhard, Phoenix, Ariz.

[73] Assignee: Motorola, Inc., Franklin Park, Ill.

[22] Filed: Dec. 1, 1971

[21] Appl. No.: 203,810

[52] U.S. Cl.................307/273, 307/221 C, 307/279

[51] Int. Cl.................H03k 3/26

[58] Field of Search..307/273, 279, 304, 205, 221 C, 307/251; 328/207

[56] References Cited

UNITED STATES PATENTS

| | | | |
|---|---|---|---|
| 3,110,870 | 11/1963 | Ziffer | 307/279 |
| 3,182,210 | 5/1965 | Jebens | 307/279 |
| 3,397,353 | 8/1968 | Hitt | 307/251 |
| 3,500,064 | 3/1970 | Wong | 307/279 |

*Primary Examiner*—Herman Karl Saalbach
*Assistant Examiner*—R. E. Hart
*Attorney*—Foorman L. Mueller et al.

[57] ABSTRACT

There is disclosed a voltage controlled pulse width, MOS, monostable circuit which comprises first and second enhancement mode MOS transistors wherein the gate electrode of the second MOS transistor is connected to the drain electrode of the first MOS transistor and the gate electrode of the first MOS transistor is connected to an RC timing circuit of which the resistor is connected between the gate electrode and the source electrode and the capacitor is connected from the gate electrode to the drain electrode of the second MOS transistor. The MOS transistors are adapted to be connected across a source of power and a third enhancement mode MOS transistor is connected as a source follower between the drain of the second MOS transistor and the source of power. A fourth enhancement mode MOS transistor is connected across the first transistor and includes a differentiating circuit connected to its gate electrode for introducing a sharp pulse into the monostable circuit for initiating its operation. The terminal of the differentiating circuit and the gate electrode of the third transistor are adapted to be supplied with the gate pulse which initiates operation of the circuit to generate an output pulse and whose amplitude determines the width, or time duration, of the output pulse.

13 Claims, 5 Drawing Figures

VARIABLE DELAY, MOS, MONOSTABLE PULSE GENERATING CIRCUIT

BACKGROUND OF THE INVENTION

This invention relates to monostable pulse generating circuits, more particularly to such circuits wherein, in the quiescent condition, the circuit draws very low power, and it is an object of the invention to provide improved circuits of this nature.

Monostable pulse generating circuits utilizing transistors generally are of the multivibrator type involving cross-coupled transistors, for example, wherein when the first one of the transistors is conducting, the second one is nonconducting and when the first one is nonconducting, the second one is conducting. Thus in the quiescent state, when no pulse is being generated, one of the transistors is conducting and is therefore consuming power. Such power consumption of course leads to inefficiency. In prior devices, such monostable pulse generating circuits have generated pulses having a time length or duration determined by the time constant of a timing circuit. Such circuits have had limited applicability because the duration of the pulse generated could be changed only by changing the resistance or the capacitance, for example, in the timing circuit. The latter involved at least, a change in the position of a rheostat, or capacitor, knob. Indirectly, ultimately such changes can be related to changes in applied control voltage. However, it is quite inconvenient to first make a resistor-capacitor setting, apply a voltage, measure the result and make a new setting, if the first one was not correct. Accordingly, it is a further object of the invention to obviate this disadvantage of the prior art, and provide an improved monostable pulse generating circuit of the nature indicated wherein the pulse length or duration can be modulated in accordance with an applied voltage, and which, at the same time, has virtually zero power consumption in the quiescent state.

It is a further object of the invention to provide improved monostable pulse generating circuits of the character indicated utilizing P-channel MOS transistors.

SUMMARY OF THE INVENTION

In carrying out the invention in one form there is provided a variable pulse width monostable pulse-producing circuit comprising in combination a first transistor having input and output electrodes and a control electrode, a second transistor having input and output electrodes and a control electrode, a corresponding one of the input and output electrodes of each of said first and said second transistors being connectible to one terminal of a source of power, the corresponding other one of the input and output electrodes of said first and second transistors being connectible to the other terminal of said source of power, a first connection from the control electrode of said second transistor to one of the input and output electrodes of said first transistor, a timing circuit connected from the control electrode of said first transistor to the corresponding one of the input and output electrodes of said second transistor, said timing circuit including a resistor connected to the control electrode of said first transistor and to the one of said input and output electrodes of said first transistor opposite to the one of the input and output electrodes of said first transistor to which said first connection is made, said first transistor having a conducting and a nonconducting state corresponding to the voltage on its control electrode and being in the nonconducting state during the nonpulse-producing condition, said second transistor having a conducting and a nonconducting state corresponding to the voltage on its control electrode and being in a conducting state during the nonpulse-producing condition, first means having conducting and nonconducting states, in response to the level of applied voltage, connected in one circuit with said corresponding one of the input and output electrodes of said second transistor and the source of power to which said corresponding electrode is connectible for preventing conduction in said circuit of said second transistor during said nonpulse-producing condition, second means for initiating conduction of said first transistor and thereby effecting a nonconducting state of said second transistor, a third means for initiating a conducting state of said first means in response to said level of applied voltage for energizing said timing circuit and thereby controlling the time of conduction of said first transistor.

In carrying out the invention according to a second form there is provided a variable pulse width monostable pulse-producing circuit comprising in combination a first P-channel, enhancement mode MOS transistor having source, drain and gate electrodes, a second P-channel, enhancement mode MOS transistor having source, drain and gate electrodes, the source electrodes of each of said first and said second transistors being connectible to one terminal of a source of power, a first resistor connected between the drain electrode of said first transistor and the other terminal of said source of power, a third P-channel, enhancement mode, MOS transistor having source, drain and gate electrodes, the source electrode of said third transistor being connected to the drain electrode of said second transistor, a second resistor connected between the drain electrode of said third transistor and the other terminal of said source of power, a first connection from the gate electrode of said second transistor to the drain electrode of said first transistor, a timing circuit including a third resistor and a first capacitor, connected from the gate electrode of said first transistor to the drain electrode of said second transistor, said third resistor being connected between the gate electrode and the source electrode of said first transistor, and said first capacitor being connected between the gate electrode of said first transistor and the drain electrode of said second transistor, a fourth resistor connected from the drain electrode of said second transistor to said one terminal of said source of power, said first transistor having a conducting and a nonconducting state corresponding to the voltage on its gate electrode and being in the nonconducting state during the nonpulse-producing condition, said second transistor having a conducting and a nonconducting state corresponding to the voltage on its gate electrode and being in a conducting state during the nonpulse-producing condition, said third transistor having a conducting and a nonconducting state corresponding to the voltage on its gate electrode and being in a nonconducting state when said second transistor is in a conducting state during said nonpulse-producing condition, means for initiating conduction of said first transistor and thereby effecting a nonconducting state of said second transistor comprising a fourth P-channel, enhancement mode MOS transistor and an RC circuit, said fourth MOS transistor having source and drain electrodes connected respectively to the source and drain electrodes of said first transistors, and having a gate electrode, said RC circuit including a fifth resistor connected between the gate electrode of said fourth transistor and said one terminal of said source of power, a second capacitor connected to the gate electrode of said fourth transistor and a pulse source, and means for initiating a conducting state of said third transistor for energizing said timing circuit and thereby controlling the time of conduction of said first transistor.

DESCRIPTION OF THE PREFERRED EMBODIMENT

Figure 1:
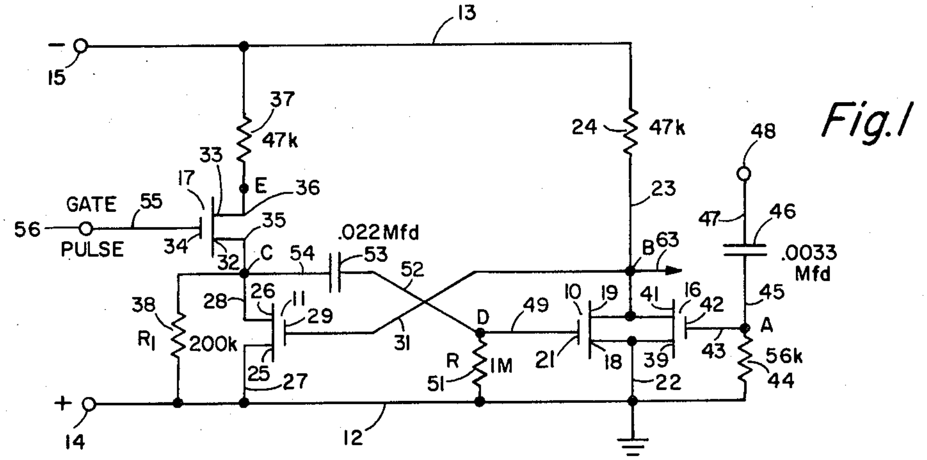
FIG. 1 is a diagram of a circuit embodying the invention.
Figure 5:
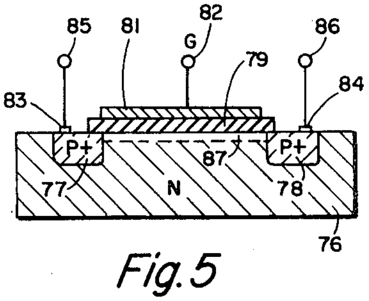
FIG. 5 is a diagrammatic representation of a P-channel MOS device utilized according to one embodiment of the invention.

Referring to FIG. 1, a monostable pulse generating circuit is shown including two MOS transistors 10 and 11 adapted to be connected between two conductors 12 and 13 which in turn are connected to terminals 14 and 15, respectively, the latter being the terminals to which a source of power may be connected. In the example being considered, the MOS transistors 10 and 11 are of the P-channel variety operating in the enhancement mode, and the terminals 14 and 15 are adapted to be connected respectively between ground and a negative voltage. The terminal 14 while at ground may be considered as a plus voltage or a zero voltage and the terminal 15 would, in either case, be connected to a negative voltage.

An MOS transistor 16 which also may be of the P-channel variety operating in the enhancement mode is connected in parallel to the transistor 10 for the introduction of a starting pulse to the circuit. An MOS transistor 17 is connected in series with the transistor 11 and is adapted to prevent conduction of current by the transistor 11 in the quiescent state of the circuit as will be more fully explained. The transistor 17 also may be of the P-channel variety operating in the enhancement mode.

While all of the transistors 10, 11, 16 and 17 have been indicated as being of the P-channel MOS variety, it will be understood that these transistors may be of the N-channel MOS variety under appropriate conditions. The transistors referred to are available from the manufacturer thereof, Motorola, Inc., the assignee of the subject application, under the designation 3N156. Other P-channel or N-channel MOS transistors may of course be used. In any event, the MOS transistors are operating in the enhancement mode whereby there is a threshold voltage which has to be applied to the gate terminal before conduction between the source and drain can take place.

The MOS transistor 10 has source and drain electrodes 18 and 19, respectively, and a gate electrode 21. The source electrode 18 is connected by means of a conductor 22 to the conductor 12, and the drain electrode 19 is connected by means of a conductor 23 to a resistor 24 and thus to the conductor 13 for completing the source – drain circuit of the transistor 10.

The MOS transistor 11 has source and drain electrodes 25 and 26, respectively, the source electrode 25 being connected by a conductor 27 to the conductor 12, and the drain electrode 26 is connected by a conductor 28 to a terminal designated by the reference character C. Transistor 11 also includes a gate electrode 29 connected by means of a conductor 31 to the conductor 23 at a terminal designated by the reference character B.

The transistor 17 has source and drain electrodes 32 and 33, respectively, and a gate electrode 34. The source electrode 32 is connected by means of a conductor 35 to the terminal C, and the drain electrode 33 is connected by a conductor 36 to a terminal designated by the reference character E from which terminal a resistor 37 extends and is connected at its other terminal to the conductor 13. Connected across the source and drain electrodes 25 and 26 of transistor 11 is a resistor 38, also connected from terminal C to the conductor 12.

The transistor 16 includes source and drain electrodes 39 and 41, respectively, and a gate electrode 42. The source and drain electrodes 39 and 41 are connected respectively to the conductors 22 and 23, and the gate electrode 42 is connected by means of a conductor 43 to a terminal designated by the reference character A which is one terminal of a resistor 44, the other terminal of which is connected to the conductor 12, and ground. The terminal A is also connected by means of a conductor 45 to one terminal of a capacitor 46, the other terminal of which is connected by means of a conductor 47 to a terminal 48 at which a starting or gate pulse may be applied.

The gate electrode 21 of transistor 10 is connected by means of a conductor 49 to a terminal designated by the reference character D from which a resistor 51 extends and is connected to the ground conductor 12. The conductor 49 and the terminal D of the resistor connected thereto are connected by means of a conductor 52 to one terminal of a capacitor 53, the other terminal of which is connected by means of a conductor 54 to the terminal C. The capacitor 53 and the resistor 51 form a timing circuit in connection with the control of the transistor 10. The gate terminal 34 of transistor 17 is connected by means of a conductor 55 to a terminal 56 to which a gate or control pulse may be applied. The same gate pulse may be applied to terminals 48 and 56 simultaneously.

The overall operation of the circuit of the invention may be explained by considering FIGS. 1 and 2 together as follows. In the quiescent condition, that is, when there is no gate voltage supplied to the terminals 48 and 46, but there is a voltage applied between terminals 14 and 15, for example, negative 25 volts at terminal 15 and ground or zero volts at terminal 14, the transistors 10 and 16 are in a nonconductive state. Hence, the potential at point B is equal to −25 volts, the voltage on conductors 13, 23 and at terminal 15. The transistor 16 is in a nonconductive state because no pulse has been applied to terminal 48 to develop a voltage at point A, its gate electrode 42. Thus the gate 42 voltage is zero, and because of resistor 44, and since transistor 16 is a P-channel MOS device operating in the enhancement mode, a threshold level of voltage must be achieved on the gate electrode 42 before conducting can take place. Under the conditions being described, the voltage on the gate terminal 21 of transistor 10 also is zero volts because the resistor 51 is connected to the ground conductor 12 and any charge previously existing on capacitor 53 has leaked off in the meantime. The −25 volts existing on conductor 23, by virtue of conductor 31, exists at the gate 29 of transistor 11 and places this transistor in a conducting state. That is to say, the voltage between the source and drain electrodes 25 and 26 is very low, in the vicinity of zero volts. Thus the potential at terminal C is essentially zero. However since no voltage is applied, in the quiescent state, to the terminal 56 and gate 34, the transistor 17 is in a nonconducting state and therefore any tendency on the part of transistor 11 to conduct is ineffective because such current would have to pass between the source and drain electrodes of transistor 17. Thus during the quiescent condition, the transistor 11 does not conduct current even though it is in a conductive state. The power consumption by the transistor 11 during the quiescent state, and of the circuit, is reduced to a minimum and is, in effect, zero.

Figure 2:
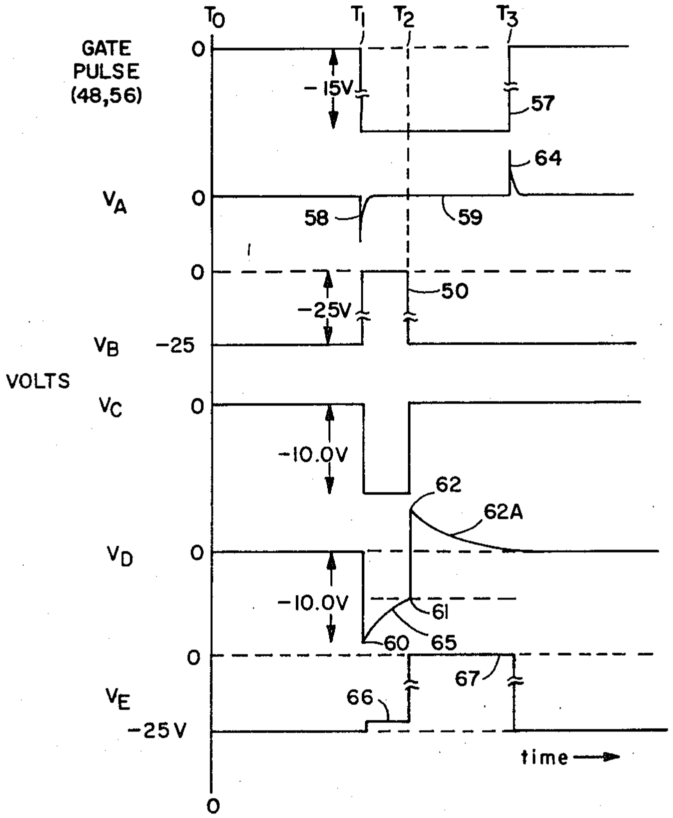
FIG. 2 is a voltage-pulse timing diagram useful in explaining the operation of the invention.

The conditions as described would be illustrated on FIG. 2 as shown by virtue of the fact that at time $T_O$, the voltage at the gates 48 and 56 is zero, the voltage at point A is zero, the voltage at point B is −25 volts, the voltage at point C is zero, the voltage at point D is zero, and the voltage at point E is −25 volts.

At the next step, for example, time $T_1$, a gate pulse of −15 volts, for example, may be applied to the gate terminals 48 and 56 as shown on FIG. 2 by the reference character 57. The gate pulse 57 has a time duration of a number of milliseconds which is greater than the maximum duration of the output pulse to be generated by the circuit at the terminal B. At the instant $T_1$, the application of −15 volts (pulse 57) to terminal 48, −15 volts appears at point A inasmuch as the capacitor 46 in the first instance acts as a short circuit. The −15 volts at point A is applied to the gate electrode 42 since this exceeds the threshold value of the transistor 16, this transistor becomes conductive whereby the voltage at point B is, in effect, reduced to a very small value, for example, zero. Inasmuch as the capacitor 46 and resistor 57 act as a differentiating circuit, the voltage appearing at terminal A, ($V_A$, FIG. 2) is a negative-going voltage spike 58 as shown. Since the voltage at point B is essentially at zero, the gate 29 of transistor 11 is at zero by virtue of conductor 31, and as a consequence, transistor 11 moves into a nonconductive state because the voltage on its gate is more positive than the threshold value of −5 volts. Since the gate pulse 57 (−15 volts) is also applied to the terminal 56 and is more negative than the threshold value of −5 volts and the voltage drop across resistor 38, the transistor 17 assumes a conductive state. The transistor 17 is acting as a source follower. In this conductive state of transistor 17, the voltage appearing at terminal C is equal to the voltage applied at the gate electrode 34 diminished by the threshold, or the turn-on, voltage of transistor 17. Thus the voltage at point C under these conditions is approximately −10.0 volts as shown by the voltage $V_C$ in FIG. 2. The instantaneous appearance of a −10.0 volts at terminal C applies to the terminal D (the gate electrode of transistor 10), −10.0 volts which appears across the resistor 51. This is shown by the voltage $V_D$ at the reference character 60 in FIG. 2. The voltage $V_C$ of course also appears across resistor 38. $V_D$, −10.0 volts, appearing on the gate electrode 21 of transistor 10 causes transistor 10 to be conductive which thereby maintains the voltage between terminal B and ground at essentially zero even though the transistor 16 has again assumed a nonconductive condition as shown by the horizontal portion 59 of the graph $V_A$ of FIG. 2. Accordingly, transistor 11 remains biased to the nonconductive condition.

However as the voltage at point C continues to be −10.0 volts, the capacitor 53 begins to charge toward this negative value, and the voltage at point D moves toward zero as the current through resistor 51 decreases as is well understood for RC charging or timing circuits. As the capacitor 53 continues to charge, the voltage at point D approaches the threshold value of about −5 volts as shown by the reference character 61 in FIG. 2. At point 61, that is at time $T_2$, the current in transistor 10 starts to decrease as the voltage at D approaches the threshold value of −5 volts. As a result of this decrease, the voltage at point B starts toward −25 volts. The change in voltage at point B causes transistor 11 to start conducting thus causing the voltage at point C to go toward ground. This reinforces the original change at point D that started to cut off transistor 10. This will be recognized as regenerative action which will continue very rapidly until transistor 10 is completely cut off and transistor 11 is completely conducting. Thus the voltage on gate terminal 29 of transistor 11 therefore becomes −25 volts and the transistor 11 assumes a conductive state. At this point both transistors 11 and 17 are conducting. The voltage at point C accordingly drops to a low value, for example, zero as shown for $V_C$ at time $T_2$ in FIG. 2. Hence the voltage at point D is raised above the zero level by virtue of the fact that the capacitor 53 has a charge on it and one terminal of the capacitor is, in effect, connected to ground. Thus the voltage at terminal D is shown by the reference character 62 on $V_D$ of FIG. 2 at the time $T_2$. The time duration of the output pulse 50 at terminal B and as shown by the arrow 63 on conductor 23 is equal to the width of the pulse 50 shown by $V_B$ on FIG. 2.

Beginning at time $T_2$, the charge on capacitor 53 begins to leak off, as shown by the graph portion 62A, through the circuit including the transistor 11 (source to drain), resistor 38, and the resistor 51. At $T_3$, which is the end of the time interval, or duration, of the gate pulse 57, the pulse voltage suddenly drops from −15 volts to zero and causes a positive-going pulse, or spike, 64 at terminal A of FIG. 1, $V_A$, FIG. 2. The spike voltage 64 being positive-going does not affect the operation of the transistor 16 and the other components in the circuit.

The beginning of the output voltage pulse 50 at terminal B ($V_B$) of FIG. 2 begins at time $T_1$ and coincides with the voltage at terminal D ($V_D$) of −10.0 volts as shown by the reference character 60. At this point the capacitor 53 has zero charge on it and as the capacitor 53 charges up as determined by the time constant of the circuit including capacitor 53 and resistor 51, the voltage at terminal D moves along the curve 65 until the point 61 is reached which is the threshold, or turn-off, level of the transistor 10. In the operation as described, the transistor 10 turns off at the voltage 61 because the voltage at point D has dropped from −10.0 to −5 or thereabouts. The time elapsed between times $T_1$ and $T_2$ which is the time duration of the pulse at terminal B is thus determined by the time constant of the timing circuit including capacitor 53 and resistor 51 once the starting voltage at point 60 has been set. The charging time of capacitor 53 being dependent upon the charging rate can be changed by changing the values of the capacitor 53 and resistor 51, thereby determining the length of time it takes for the voltage to move from point 60 to point 61, $V_D$ of FIG. 2. However the length of time that it takes for the voltage $V_D$ to reach the level at point 61 is also dependent upon the magnitude of the voltage at point 60.

The width of the output pulse will be equal to one time constant when the peak negative-going voltage at D is equal to the threshold voltage ($V_{th}$) × 1/0.37. For the present case (threshold volts equal to 5 volts) the peak negative voltage (point 60) would have to be about 13.5 volts. In an actual case tested, the time constant was 0.022 seconds and a pulse width of 0.02 seconds was obtained with an input gate voltage of 20 volts (corresponding to a peak negative voltage at D of 15 volts). The values of the various circuit parameters are shown on the drawing.

The graph of $V_E$ in FIG. 2 illustrates the voltage changes taking place at the terminal E throughout the time interval from $T_0$ to $T_3$. The voltage at point E, ($V_E$) is −25 volts until the time $T_1$ because there is no current through resistor 37, transistor 17 being non-conducting. At time $T_1$, transistor 17 becomes conducting, transistor 11 becomes nonconducting but there is current through resistor 37, through drain and source of transistor 17 and resistor 38, this being represented by the small voltage rise 66 of FIG. 2. At time $T_2$ when transistor 11 becomes conducting and transistor 17 is still conducting by virtue of the fact that the gate pulse 57 is still applying voltage to terminal 56, the voltage drop across the transistors 11 and 17 in series is small and virtually zero as represented by the reference character 67 of FIG. 2. Thus there is no current through transistor 11 from $T_0$ to $T_1$ and from $T_1$ to $T_2$. There is current through transistor 11 from $T_2$ to $T_3$. Again there is no current through transistor 11 beyond $T_3$ to another and subsequent $T_2$. The time between $T_3$ and a subsequent $T_0$ is, of course, the quiescent period during which transistors or prior art circuits corresponding to transistor 11 were in a circuit which was conducting current.

Figure 3:
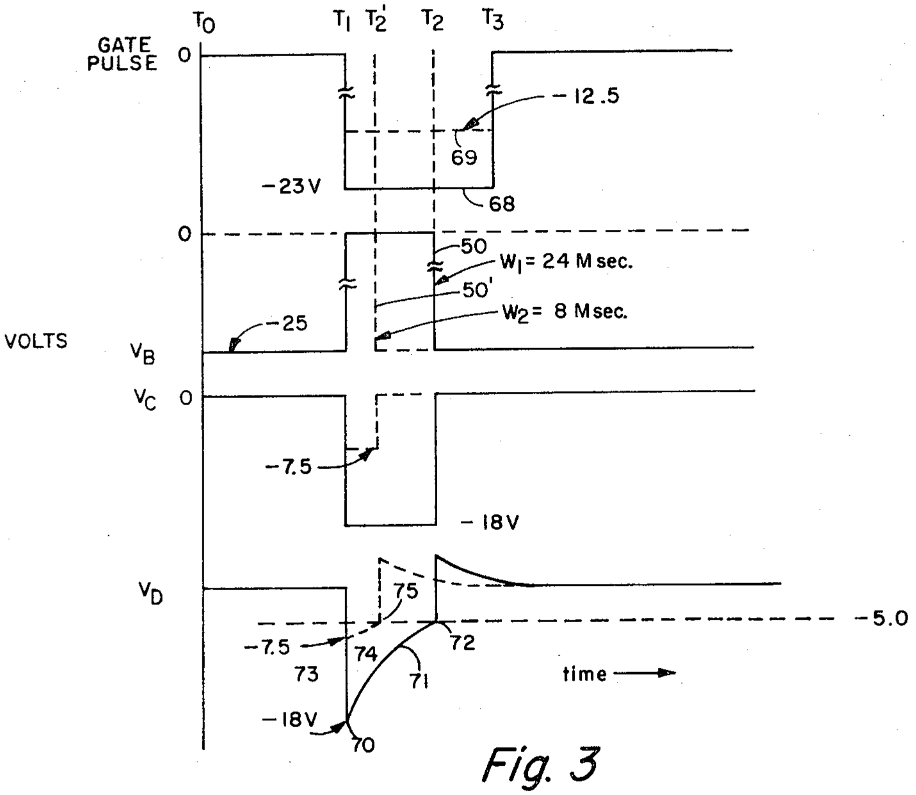
FIG. 3 is a voltage-pulse timing diagram illustrating voltage modulation of the output pulse of the circuit.

Comparing FIGS. 2 and 3 together with FIG. 1, it will be understood how the pulse width or time duration may vary with the magnitude of the voltage applied to the terminal 56. The voltage pulse 50 at terminal B shown in Figure, also is shown in FIG. 3 as having two time intervals; one between $T_1$ and $T_2$, and the other between $T_1$ and $T_2'$.

In FIG. 3 the pulse waveforms $V_B$, $V_C$ and $V_D$ correspond to the correspondingly labeled pulse waveforms of FIG. 2. In FIG. 3 two voltage values of input gate pulses are shown as applied to terminals 56 and 48 of FIG. 1. That is to say, in one case a voltage of −23 volts is applied to the terminals 56 and 48, and in the second case, a voltage of −12.5 volts is applied to these same terminals. These voltage values are indicated by the lines 68 and 69 of FIG. 3. Output pulses 50 and 50′ corresponding to these voltage values are obtained. The width modulation takes place because transistor 17 acts as a source follower causing the voltage at point C to equal the gate pulse voltage (terminal 56) minus the threshold voltage of transistor 17. Thus a −23 volt gate pulse produces a −18 volt pulse at point C, $V_C$ of FIG. 3, and a peak negative swing of 18 volts at point D, reference character 70. On the other hand a −12.5 volt gate pulse produces a −7.5 volt pulse at point C and a peak negative swing of 7.5 volts at point D.

Considering first the case wherein −23 volts is applied to terminals 48 and 56, and thus to the gates 34 and 42, and comparing the pulse wave shapes of $V_D$ of FIGS. 2 and 3, it will be evident that the voltage at terminal D will be −18 volts in the case of FIG. 3 at time $T_1$ because this voltage is equal to the applied voltage at the gate diminished by the threshold value of transistor 17 which, for this case, is taken to be about 5 volts. The time necessary for the capacitor 53 to charge to the point where the voltage at point D is −5 volts is shown by the curve 71 of $V_D$ in FIG. 3. When the voltage rise of $V_D$ reaches the point 72 at the threshold of −5 volts, the transistor 10 becomes non-conducting and the transistor 11 conducts as already described. This is the time $T_2$ and indicates the end of the pulse 50. As may be seen in FIG. 3, the pulse 50 may have a width of 24 milliseconds.

In the second case wherein −12.5 volts is applied to the terminals 48 and 56, and thus to the gates 42 and 34, the threshold voltage of transistor 17 still being about 5 volts, the voltage at point C is equal to −7.5 volts, as may be seen in the curves $V_C$ and $V_D$ of FIG. 3. Referring to $V_D$ in FIG. 3, the reference character 73 represents the voltage $V_D$ at the start of the pulse and the curve 74 represents the charging rate of capacitor 53. It will be seen that the curve 74 reaches the threshold level of transistor 10, namely, 5 volts, at the time of $T_2'$ which is substantially less than the time $T_2$. The point at which the charging curve 74 reaches the threshold value is shown by the reference character 75. The pulse represented by the interval between $T_1$ and $T_2'$ is identified by the reference character 50′ and is substantially less than the width of pulse 50 represented by the time $T_2$.

The greater the value of the voltage applied to the gate 56, the wider, or greater time duration, is the resulting output pulse at terminal B.

Figure 4:
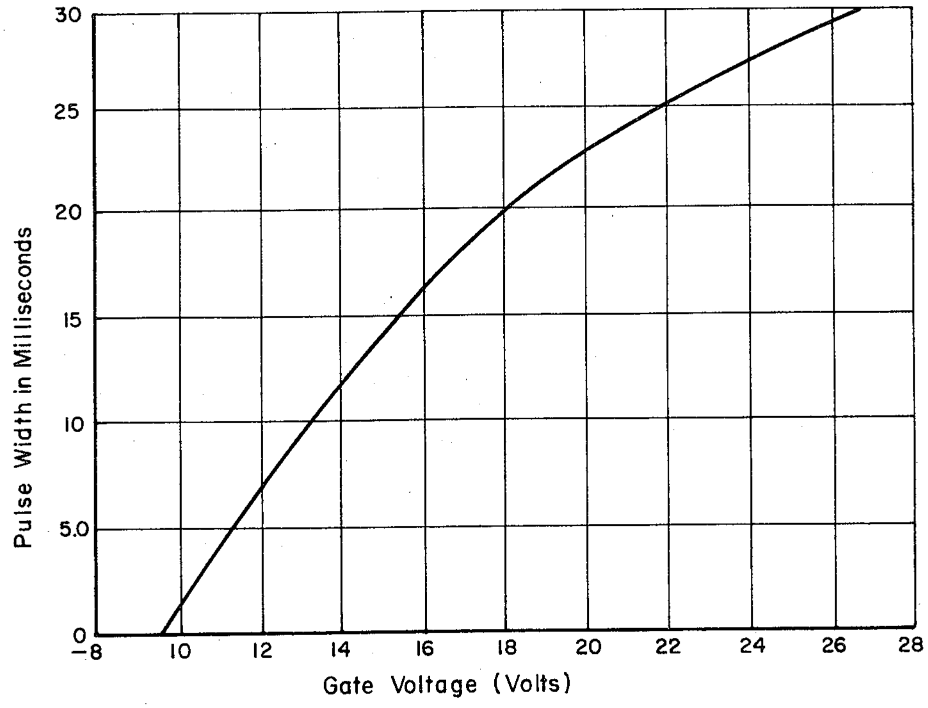
FIG. 4 is a graph showing variation of pulse width, or duration, in accordance with applied control voltage.

In FIG. 4 there is shown a plot of pulse width in milliseconds against the gate voltage at terminal 56 and shows that there is essentially a linear relationship between the width of the output pulse and the input voltage for pulse widths up to about 10 to 15 milliseconds. Beyond that time interval the relationship becomes nonlinear. Pulse widths from fractional values of milliseconds to as high as about 30 milliseconds were observed for voltages varying from about 8 volts to 26 volts.

The circuit can be operated with a steady-state DC voltage applied to the gate of transistor 17, that is, to terminal 56. In this case transistor 17 and transistor 11 are in a conducting state in the quiescent condition, and triggering is by means of a narrow negative pulse at the point A. In this case also the voltage magnitude applied to the gate terminal 34 determines the width of the output Pulses at terminal B.

The width of the output pulses may be modulated by a slowly varying alternating voltage provided that a DC vias voltage is used at terminal 56 in order to avoid transient and/or nonlinearities. The advantages of low current and modulation by a slowly varying voltage may be obtained simultaneously by adding an additional transistor between the drain of transistor 17 and the bottom end of resistor 37. This added transistor can be turned on by a timing pulse (which must be longer than the longest desired output pulse) and the DC or slowly varying "signal" voltage applied to the gate of transistor 17 will now control the width of the output pulse. In order to obtain the full range of output pulse widths the pulse that turns on the added transistor must be greater than the supply voltage by at least one threshold drop (−25 −5 = −30 volts).

Referring again to FIGS. 2 and 3, it will be evident that the width of the output pulse at terminal B cannot be any greater than the time span between $T_1$ and $T_3$ inasmuch as the time width of the applied gate pulse determines the length of time that the transistor 17 is in a conductive condition.

Referring to FIG. 6 there is shown diagrammatically a P-channel MOS transistor which would operate in the enhancement mode. Thus in FIG. 6 there is shown an N-type substrate 76 into which $P^+$ regions 77 and 78 have been formed such as by diffusion of appropriate impurities. Spanning the distance between the $P^+$ regions 77 and 78 which may be characterized as source and drain, respectively, is an insulating layer 79 formed, for example, or silicon dioxide. Lying on top of the silicon dioxide layer 79 is a metallic or conducting layer 81 also spanning across the N region between the two $P^+$ regions 77 and 78. A gate terminal 82 is applied to the metallic layer 81, and metallic contacts 83 and 84 are applied to the $P^+$ regions 77 and 78, respectively. To the latter metallic contacts, terminals 85 and 86 may be applied, respectively. As is well understood, when a gate voltage is applied to the terminal 82 and has a sufficient magnitude, that is, greater than the threshold value, a P-channel 87 is induced into the N layer underneath the oxide layer 79 thereby creating a conducting path in the N layer between the two $P^+$ regions 77 and 78.

It will be evident that the circuit may readily be formed as an integrated circuit. In this case the load resistors 24 and 37 would be replaced with MOS load devices, while the other resistors and the capacitors might be external or part of the integrated circuit.

What is claimed is:

1. A variable pulse width monostable pulse-producing circuit comprising:

a first transistor having input and output electrodes and a control electrode;

a second transistor having input and output electrodes and a control electrode;

a corresponding one of the input and output electrodes of each of said first and said second transistors being connectible to one terminal of a source of power;

the corresponding other one of the input and output electrodes of said first and second transistors being connectible to the other terminal of said source of power;

a first connection from the control electrode of said second transistor to one of the input and output electrodes of said first transistor;

a timing circuit including a first resistor and a first capacitor in series connected from the control electrode of said first transistor to the corresponding one of the input and output electrodes of said second transistor;

said first resistor being connected to the control electrode of said first transistor and to the one of said input and output electrodes of said first transistor opposite to the one of the input and output electrodes of said first transistor to which said first connection is made;

said first capacitor being connected at one terminal to said first resistor at its point of connection to the control electrode of said first transistor and at its second terminal to the output electrode of said second transistor;

said first transistor having a conducting and a nonconducting state corresponding to the voltage on its control electrode and being in the nonconducting state during the nonpulse-producing condition;

said second transistor having a conducting and a nonconducting state corresponding to the voltage on its control electrode and being in a conducting state during the nonpulse-producing condition;

first means having conducting and nonconducting states, in response to a level of applied voltage, connected in one circuit with said corresponding one of the input and output electrodes of said second transistor and the source of power to which said corresponding electrode is connectible for preventing conduction in said circuit of said second transistor during said nonpulse-producing condition and for creating a voltage responsive threshold voltage during said pulse-producing condition;

second means for initiating conduction of said first transistor and thereby effecting a nonconducting state of said second transistor; and third means for initiating a conducting state of said first means in response to said level of applied voltage for energizing said timing circuit with said voltage responsive threshold voltage and thereby controlling the time of conduction of said first transistor.

2. The monostable pulse-producing circuit according to claim 1 wherein said first means comprises a third transistor having input and output electrodes in said one circuit and a control electrode for creating said conducting and nonconducting states, in response to the level of applied voltage to said control electrode.

3. The monostable pulse-producing circuit according to claim 2 wherein the first, second and third transistors are MOS transistors functioning in the enhancement mode.

4. The monostable pulse-producing circuit according to claim 3 wherein the MOS transistors are P-channel transistors.

5. The monostable pulse-producing circuit according to claim 2 wherein the second means for initiating conduction for first transistor comprises a fourth transistor having input and output electrodes connected in parallel to the input and output electrodes of said first transistor and a control electrode;

a resistor connected to said control electrode and to the source of power to which the resistor of said timing circuit is connected; and a second capacitor having one terminal connected to said resistor and another terminal adapted to be connected to a control pulse.

6. The monostable pulse-producing circuit according to claim 5 wherein the first, second, third and fourth transistors are MOS transistors functioning in the enhancement mode.

7. The monostable pulse-producing circuit according to claim 6 wherein the control electrode of said third transistor and the other terminal of said second capacitor are connectible to the same initiating pulse.

8. A variable pulse width monostable pulse-producing circuit comprising:

a first MOS transistor having source, drain and gate electrodes;

a second MOS transistor having source, drain and gate electrodes;

the source electrodes of each of said first and said second transistors being connectible to one terminal of a source of power;

a first resistor connected between the drain electrode of said first transistor and the other terminal of said source of power;

a third MOS transistor having source, drain and gate electrodes, the source electrode of said third transistor being connected to the drain electrode of said second transistor;

a second resistor connected between the drain electrode of said third transistor and the other terminal of said source of power;

a first connection from the gate electrode of said second transistor to the drain electrode of said first transistor;

a timing circuit including a third resistor and a first capacitor, connected from the gate electrode of said first transistor to the drain electrode of said second transistor;

said third resistor being connected between the gate electrode and the source electrode of said first transistor, and said first capacitor being connected between the gate electrode of said first transistor and the drain electrode of said second transistor;

a fourth resistor connected from the drain electrode of said second transistor to said one terminal of said source of power;

said first transistor having a conducting and a nonconducting state corresponding to the voltage on its gate electrode and being in the nonconducting state during the nonpulse-producing condition;

said second transistor having a conducting and a nonconducting state corresponding to the voltage on its gate electrode and being in a conducting state during the nonpulse-producing condition;

said third transistor having a conducting and a nonconducting state corresponding to the voltage on its gate electrode and being in a nonconducting state when said second transistor is in a conducting state during said nonpulse-producing condition;

means for initiating conduction of said first transistor and thereby effecting a nonconducting state of said second transistor; and means for initiating a conducting state of said third transistor for energizing said timing circuit and thereby controlling the time of conduction of said first transistor.

9. The monostable pulse-producing circuit according to claim 8 wherein the means for initiating conduction of said first transistor comprises:

a fourth MOS transistor and an RC circuit;

said fourth MOS transistor having source and drain electrodes connected respectively to the source and drain electrodes of said first transistor, and having a gate electrode;

said RC circuit including a fifth resistor connected between the gate electrode of said fourth transistor and said one terminal of said source of power; and a second capacitor connected to the gate electrode of said fourth transistor and a pulse source.

10. The monostable pulse-producing circuit according to claim 9 wherein said first, second, third and fourth MOS transistors are adapted to operate in the enhancement mode.

11. The monostable pulse-producing circuit according to claim 10 wherein the MOS transistors are P-channel devices.

12. The monostable pulse-producing circuit according to claim 10 wherein the voltage applied to the timing circuit connected to the gate electrode of said first transistor is dependent upon the magnitude of the voltage applied to the gate electrode of said third transistor and the threshold voltage of said third transistor.

13. The monostable pulse-producing circuit according to claim 12 wherein the same voltage pulse may be applied to the gate terminal of said third transistor and to said second capacitor.

* * * * *